United States Patent
Trunov et al.

(10) Patent No.: US 11,764,185 B2
(45) Date of Patent: Sep. 19, 2023

(54) DIFFUSION SOLDERING PREFORM WITH VARYING SURFACE PROFILE

(71) Applicant: Infineon Technologies Austria AG, Villach (AT)

(72) Inventors: Kirill Trunov, Warstein (DE); Thomas Hendrix, Erwitte (DE)

(73) Assignee: Infineon Technologies Austria AG, Villach (AT)

( * ) Notice: Subject to any disclaimer, the term of this patent is extended or adjusted under 35 U.S.C. 154(b) by 44 days.

(21) Appl. No.: 17/462,573

(22) Filed: Aug. 31, 2021

(65) Prior Publication Data

US 2023/0065738 A1    Mar. 2, 2023

(51) Int. Cl.
*H01L 23/00*   (2006.01)

(52) U.S. Cl.
CPC .............. *H01L 24/81* (2013.01); *H01L 24/13* (2013.01); *H01L 2224/13201* (2013.01); *H01L 2224/13205* (2013.01); *H01L 2224/13209* (2013.01); *H01L 2224/13211* (2013.01); *H01L 2224/13213* (2013.01); *H01L 2224/13218* (2013.01); *H01L 2224/81825* (2013.01); *H01L 2924/0103* (2013.01); *H01L 2924/014* (2013.01); *H01L 2924/0105* (2013.01); *H01L 2924/01031* (2013.01); *H01L 2924/01048* (2013.01);

(Continued)

(58) Field of Classification Search
None
See application file for complete search history.

(56) References Cited

U.S. PATENT DOCUMENTS

| 4,475,007 A | 10/1984 | Ohno |
| 5,616,206 A * | 4/1997 | Sakatsu ............... H01L 21/4853 427/272 |

(Continued)

FOREIGN PATENT DOCUMENTS

EP    3772088 A2    2/2021

OTHER PUBLICATIONS

Heinrich, Alexander, et al., "Pre-Plating of Solder Layer on Solderable Elements for Diffusion Soldering", U.S. Appl. No. 16/987,790 filed Aug. 7, 2020, 1-25.

(Continued)

*Primary Examiner* — Hung K Vu
(74) *Attorney, Agent, or Firm* — Murphy, Bilak & Homiller, PLLC

(57) ABSTRACT

A method of soldering includes providing a substrate having a first metal joining surface, providing a semiconductor die having a second metal joining surface, providing a solder preform having a first interface surface and a second interface surface, arranging the solder preform between the substrate and the semiconductor die such that the first interface surface faces the first metal joining surface and such that the second interface surface faces the second metal joining surface, and performing a mechanical pressure-free diffusion soldering process that forms a soldered joint between the substrate and the semiconductor die by melting the solder preform and forming intermetallic phases in the solder. One or both of the first interface surface and the second interface surface has a varying surface profile that creates voids between the solder preform and one or both of the substrate and the semiconductor die before the melting of the solder preform.

14 Claims, 5 Drawing Sheets

(52) U.S. Cl.
CPC .............. *H01L 2924/01049* (2013.01); *H01L 2924/01083* (2013.01)

(56) References Cited

U.S. PATENT DOCUMENTS

| | | |
|---|---|---|
| 9,272,371 B2 * | 3/2016 | Hoepfner .............. H05K 1/181 |
| 2007/0091574 A1 | 4/2007 | Jarrett et al. |
| 2012/0255991 A1 | 10/2012 | Swearingen |
| 2014/0008419 A1 * | 1/2014 | Takahashi ................ B23K 1/19 228/208 |
| 2014/0193658 A1 | 7/2014 | Ross et al. |
| 2017/0047304 A1 | 2/2017 | Kuczynski et al. |
| 2020/0119510 A1 | 4/2020 | Stroemberg et al. |
| 2021/0143120 A1 | 5/2021 | Heinrich et al. |
| 2021/0143123 A1 | 5/2021 | Trunov et al. |

OTHER PUBLICATIONS

Trunov, Kirill, et al., "Batch Soldering of Different Elements in Power Module", U.S. Appl. No. 16/902,725 filed Jun. 16, 2020, 1-24.

* cited by examiner

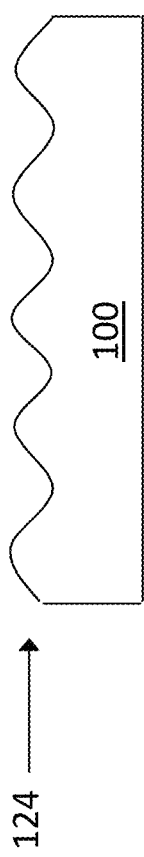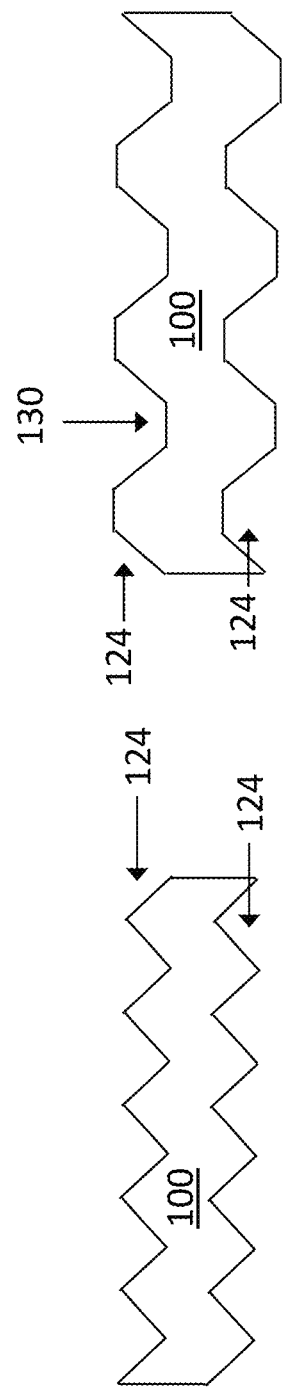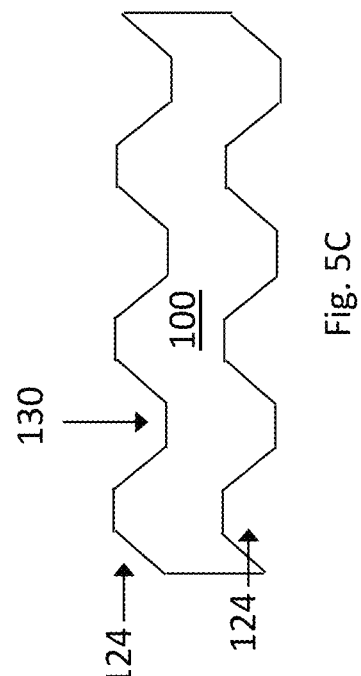
FIGURE 5

DIFFUSION SOLDERING PREFORM WITH VARYING SURFACE PROFILE

BACKGROUND

Thermal and electrical performance play an increasing role in the advancement of semiconductor technologies. These factors, coupled with miniaturization and increased performance, demand a high-performance die (chip) attach process and material. Diffusion soldering is one such die attach process.

Diffusion soldering can be performed by sputtering a layer of solder material onto the backside of a semiconductor wafer. The deposition of the solder material represents a significant fraction of the overall wafer cost. According to a mechanical pressure-based diffusion soldering technique, mechanical pressure is applied individually to each die during solder reflow, and must be maintained until a significant portion of the solder has solidified isothermally. This limits the throughput of the die attach process. In addition, the soldering temperature must be high to enable a full reaction and isothermal solidification in a short time. Alternatively, a mechanical pressure-free diffusion soldering technique may be used to facilitate more efficient batch soldering of components. However, a mechanical pressure-free diffusion soldering technique introduces separate challenges that impact the quality of the soldered joint.

Thus, there is a need for improved diffusion soldering techniques.

SUMMARY

A method of soldering a semiconductor device. According to an embodiment, the method comprises providing a substrate comprising a first metal joining surface, providing a semiconductor die comprising a second metal joining surface, providing a solder preform that comprises a first interface surface and a second interface surface opposite the first interface surface, arranging the solder preform in between the substrate and the semiconductor die such that the first interface surface faces the first metal joining surface and such that the second interface surface faces the second metal joining surface, and performing a mechanical pressure-free diffusion soldering process that forms a soldered joint between the substrate and the semiconductor die by melting the solder preform and forming intermetallic phases in the soldered joint, wherein one or both of the first interface surface and the second interface surface has a varying surface profile that creates voids between the solder preform and one or both of the substrate and the semiconductor die before the melting of the solder preform.

Separately or in combination, the varying surface profile comprises a plurality of ridges and channels that are disposed between immediately adjacent ones of the ridges, and wherein the channels create the voids in the arrangement of the solder preform in between the substrate and the semiconductor die.

Separately or in combination, at least one of the channels laterally extends completely between two edge sides of the solder preform.

Separately or in combination, at least one of the channels laterally extends from one edge side of the solder preform to a central region of the solder preform, wherein the central region is spaced apart from every edge side of the solder preform by at least twenty five percent of a minimum width of the solder preform.

Separately or in combination, the ridges and channels have an undulating profile along a cross-section of the solder preform that is orthogonal to the ridges.

Separately or in combination, both of the first interface surface and the second interface surface have the same undulating profile, and wherein the solder preform has a substantially uniform thickness along the cross-section of the solder preform that is orthogonal to the ridges.

Separately or in combination, a thickness of the solder perform is between 5 µm and 15 µm.

Separately or in combination, a separation distance between two immediately adjacent ones of the ridges is between two and fifty times the thickness of the solder preform.

Separately or in combination, the varying surface profile is such that a plurality of the ridges are regularly spaced apart from one another by a fixed separation distance that is between two and fifty times the thickness of the solder preform.

Separately or in combination, a maximum vertical displacement of the solder preform between the first interface surface and the second interface surface is between four times the thickness of the solder preform and ten times the thickness of the solder preform.

Separately or in combination, the solder preform comprises Sn, Zn, In, Ga, Bi, Cd or any alloy thereof.

Separately or in combination, performing the mechanical pressure-free diffusion soldering process comprises a conditioning step that removes a tacking agent from the arrangement of the solder preform in between the substrate and the semiconductor die.

Separately or in combination, performing the mechanical pressure-free diffusion soldering process comprises an activation step that introduces formic acid into a soldering furnace that contains the arrangement of the solder preform in between the substrate and the semiconductor die.

According to another embodiment, the method comprises providing a substrate comprising a first metal joining surface, providing a semiconductor die comprising a second metal joining surface, providing a solder preform that comprises a first interface surface and a second interface surface opposite the first interface surface, arranging the solder preform in between the substrate and the semiconductor die such that the first interface surface faces the first metal joining surface and such that the second interface surface faces the second metal joining surface, placing the arrangement of the solder preform in between the substrate and the semiconductor die in a soldering furnace, performing one or more pre-soldering steps in the soldering furnace below a reflow temperature of the solder preform with the arrangement of the solder preform contained in the soldering furnace, increasing the temperature of the soldering furnace to reach a melting temperature of the solder preform such that the solder preform melts and reacts with the first and second metal joining surfaces to form intermetallic phases in a soldered joint without applying mechanical pressure to the arrangement, wherein during the pre-soldering steps the arrangement of the solder preform in between the substrate and the semiconductor die comprises channels between the solder preform and one or both of the substrate and the semiconductor die, and wherein the channels permit ingress and egress of ambient atmosphere within the soldering furnace.

Separately or in combination, at least one of the channels provides a complete passage for the ambient atmosphere to flow between two edge sides of the solder preform.

Separately or in combination, at least one of the channels permit the ambient atmosphere to reach a central region of the solder preform, wherein the central region is spaced apart from every edge side of the solder preform by at least 1 mm.

Separately or in combination, arranging the solder preform comprises providing an a tacking agent between the solder preform and one or both of the substrate and the semiconductor die, and wherein performing the one or more pre-soldering steps comprises a conditioning step that increases a temperature in the soldering furnace, and wherein vapours of the tacking agent are outgassed through the channels during the conditioning step.

Separately or in combination, performing the one or more pre-soldering steps comprises an activation step that introduces formic acid into the soldering furnace, and wherein the ambient atmosphere of the soldering furnace comprises the formic acid and flows through the channels during the activation step.

Separately or in combination, a thickness of the solder perform is between 5 μm and 15 μm.

Separately or in combination, a temperature in the soldering furnace does not exceed 200° C. during the one or more pre-soldering steps.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5, which includes FIGS. 5A-5C, illustrates side-views of solder preforms with a varying surface profile, according to various embodiments.

DETAILED DESCRIPTION

A mechanical pressure-free diffusion soldering technique that utilizes an advantageously configured solder preform is described herein. The solder preform comprises a varying surface profile on one or both surfaces of the solder preform that interface with the metal joining surfaces in the soldered joint. The varying surface profile has a non-planar geometry that creates voids between the solder preform and the semiconductor die and/or between the solder preform and the substrate before the solder is melted. These voids form channels that permit outgassing during pre-soldering steps that are performed on the assembly before the solder preform is melted. These pre-soldering steps may include an initial step that removes a tacking agent from the assembly and a subsequent step that de-oxidizes the soldering surfaces of the assembly. As a result, there is improved wetting between the solder preform and the semiconductor die and/or between the solder preform and the substrate, and hence improved quality of the completed soldered joint.

Figure 1:
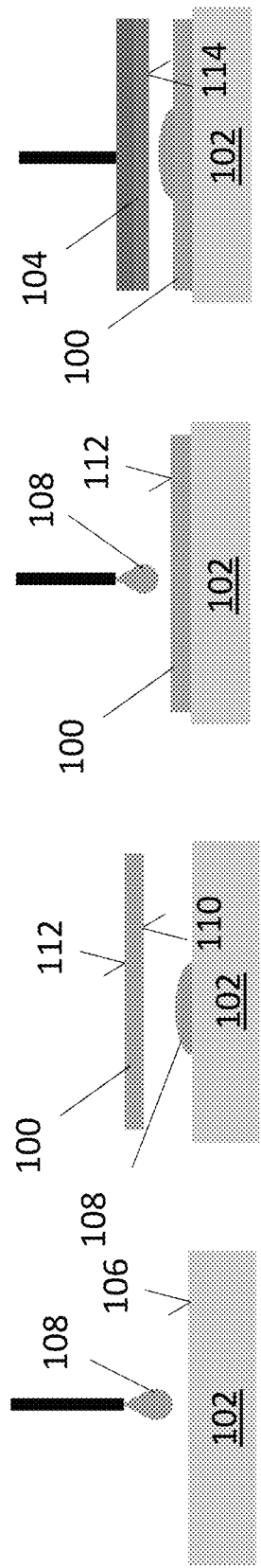
FIG. 1 illustrates steps for forming an arrangement of a solder preform between a substrate and a semiconductor die, according to an embodiment.

Referring to FIG. 1, selected steps for arranging a solder preform 100 in between a substrate 102 and a semiconductor die 104 are depicted. While the figure depicts an arrangement with a single semiconductor die 104, the techniques described herein are more generally applicable to batch soldering techniques wherein multiple semiconductor dies 104 are soldered at the same time. According to these batch soldering techniques, more than one semiconductor die 104 can be soldered to the same or different substrate 102 according to the same process. These semiconductor dies 104 may be the same or different from one another.

Referring to FIG. 1A, a substrate 102 comprising a first metal joining surface 106 is provided. The substrate 102 is a carrier that is configured to accommodate the mounting of semiconductor dies 104 and/or passive electrical elements thereon. For example, the substrate 102 can be a PCB (printed circuit board) or a power electronics substrate 102 such as a DBC (direct bonded copper) substrate, an AMB (active metal brazed) substrate, or an insulated metal substrate (IMS). In these examples, the substrate 102 may comprise one or more dielectric layers (not shown) that are formed from ceramics ($Al_2O_3$, AlN, etc.), plastics, laminates, pre-peg materials (FR-2, FR-4, CEM-1, G-10, etc.), and a structured metallization layer disposed on an upper surface of the substrate 102, wherein the first metal joining surface 106 corresponds to a die attach surface of this structured metallization layer. Alternatively, the substrate 102 can be an exclusively metal structure, such as a lead frame. The first metal joining surface 106 can be provided by a metal structure that comprises or is plated with any or more of Cu, Ni, Ag, Au, Pd, Pt, NiV, NiP, NiNiP, NiP/Pd, Ni/Au, NiP/Pd/Au, or NiP/Pd/AuAg. In an embodiment, the first metal joining surface 106 is a bond pad or die pad that is formed from Cu or Cu alloy and has an Ni based coating formed on the outer surfaces of the Cu or Cu alloy.

A tacking agent 108 is applied to the first metal joining surface 106. The tacking agent 108 is an inert substance that is used to keep the assembly of the solder preform 100 and semiconductor die 104 in place during transportation to a solder furnace. Generally speaking, the tacking agent 108 can be any non-volatile, non-reactive liquid which keeps the solder preform 100 in place on the substrate 102 by surface tension. For example, the tacking agent 108 can be a commercially available non-reactive liquid such as Fluorinert® Electronic Liquid FC-43, which is produced by 3M®.

Referring to FIG. 1B, a solder preform 100 that comprises a first interface surface 110 and a second interface surface 112 opposite the first interface surface 110 is provided. The solder preform 100 may comprise Sn, Zn, In, Ga, Bi, Cd or any alloy thereof. For example, the solder preform 100 may comprise Sn/Ag/Cu, Sn/Ag, Sn/Ag/Sb, Sn/Sb, Sn/Cu or Au80/Sn20. Still other types of thin solder preforms 100 may be used.

Referring to FIG. 1C, after the solder preform 100 is arranged on the substrate 102, the tacking agent 108 is additionally applied to the second interface surface 112 of the solder preform 100. The tacking agent 108 used in this step may be the same or different as the tacking agent 108 used to secure the solder preform 100 to the substrate 102.

Referring to FIG. 1D, a semiconductor die 104 is provided. The semiconductor die 104 comprises a second metal joining surface 114 that will be soldered to the substrate 102. The second metal joining surface 114 may be a bond pad of the semiconductor die 104. This bond pad may comprise and/or be plated with Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag. Generally speaking, the semiconductor die 104 can have any device configuration. In an embodiment, the semiconductor die 104 is configured as a power transistor such as a MOSFET (metal-oxide semiconductor field-effect transistor), IGBT (insulated gate bipolar transistor), HEMT (high electron mobility transistor), etc. Alternatively, the semiconductor die 104 may be configured as a logic die such as a gate driver, microcontroller, memory, etc., or a passive die such as an inductor or capacitor die, etc. In these examples, the second metal joining surface 114 can be a bond pad that provides external accessibility to a device terminal, e.g., source, drain, collector, emitter, gate, anode, etc.

The semiconductor die 104 is arranged on the solder preform 100 such that the second metal joining surface 114 faces the solder preform 100 with the tacking agent 108 disposed between the two. The tacking agent 108 maintains the position of the semiconductor die 104 relative to the solder preform 100 by surface tension. A clamping mechanism (not shown) may be used to handle the solder preform 100 and to transport the assembly to a diffusion soldering oven.

As a result of the steps shown in FIG. 1, the solder preform 100 is arranged in between the substrate 102 and the semiconductor die 104 such that the first interface surface 110 faces the first metal joining surface 106 and such that the second interface surface 112 faces the second metal joining surface 114. Alternate methods may be used to obtain the same arrangement. For example, in another embodiment, the solder preform 100 is initially applied to the semiconductor die 104. In this case, the substrate 102 in FIG. 1B instead would be the semiconductor die 104 or a semiconductor wafer from which the die is produced. For example, the solder preform 100 may be applied to a front side or a back side of a semiconductor wafer which includes the semiconductor die 104 and a plurality of additional semiconductor dies 104, or may be applied to the front side or back side of the semiconductor die 104 after the die singulation process. Subsequently, the semiconductor die 104 with the solder preform 100 may be placed on the first metal joining surface 106 of the substrate 102 with a tacking agent 108 in between.

Figure 2:
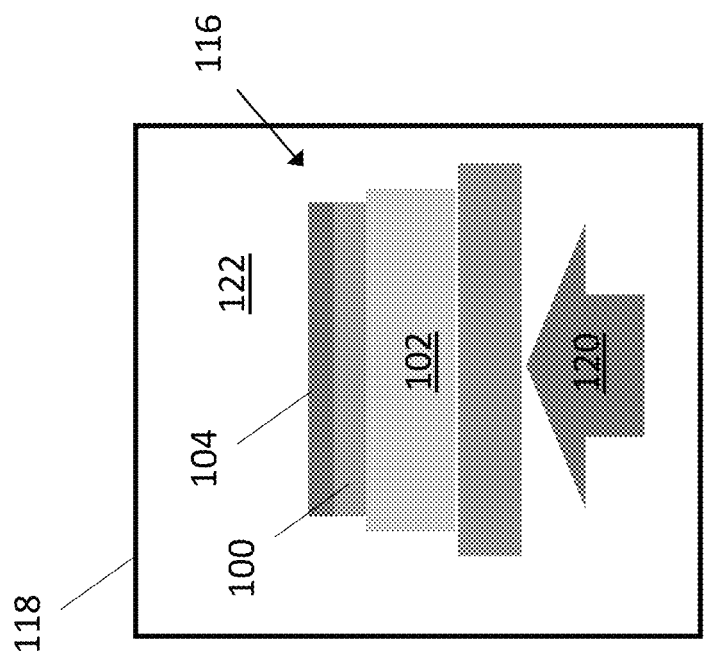
FIG. 2 illustrates a soldering furnace that contains an arrangement of the solder preform between a substrate and a semiconductor die, according to an embodiment.

Referring to FIG. 2, the arrangement 116 of the solder preform 100 between the substrate 102 and the semiconductor die 104 as described with reference to FIG. 1 is placed in a soldering furnace 118. The soldering furnace 118 may be a vacuum oven that is configured to apply heat 120 to the assembly and to simultaneously vary the pressure within the soldering furnace 118, including to vacuum conditions.

With the arrangement 116 contained within the in the soldering furnace 118, a mechanical pressure-free diffusion soldering process that forms a soldered joint between the substrate 102 and the semiconductor die 104 can be performed. According to this technique, heat 120 is applied to the arrangement 116 such that the solder preform 100 melts and reacts with the first and second metal joining surfaces 106, 114 to form intermetallic phases in the soldered joint. An intermetallic phase is a chemical compound consisting of two or more different metals which has a different crystallographic structure as the elements it is composed of. For example, in the case of an Sn based solder material that is provided between Cu based metal surfaces, the soldered joint may include intermetallic phases of CuSn with different crystallographic properties than alloyed CuSn or metallic Cu and metallic Sn. If the first metal joining surface 106 comprises a different metal/metal alloy as the second metal joining surface 114, a plurality of different intermetallic phases are formed throughout the soldered joint. The intermetallic phases have a higher melting point than the soft solder alloy which forms which form the intermetallic phases, e.g., SnCu or $SnSb_2$ in the above example. The presence of the intermetallic phases in the soldered joint results in the soldered joint having a high tensile strength that is durable with respect to thermal expansion forces caused by high temperature operation. The conditions of the soldering process (e.g., time and temperature) can be selected such that a significant percentage of the soldered joint consists of the intermetallic phases, e.g., intermetallic phase ratios of greater than 50%, greater than 75%, etc. Additionally or alternatively, the conditions of the soldering process can be selected such that the intermetallic phases are present throughout an entire thickness of the soldered joint.

The diffusion soldering process is a mechanical pressure-free diffusion soldering process. This means that no mechanical pressure is applied directly to the semiconductor die 104, e.g., from a movable press, during the melting and reaction of the solder material and/or during a subsequent hardening phase. In order to produce a soldered joint with desirable intermetallic phase characteristics, e.g., the intermetallic phase ratio and/or distribution of the intermetallic phases as described above, a solder preform 100 that is relatively thin can be used, e.g., a thickness of no more than 50 μm, and more typically less than 30 μm.

The mechanical pressure-free diffusion soldering process may comprise performing one or more pre-soldering steps in the soldering furnace 118 before the reflow (melting) of the solder preform 100. During these pre-soldering steps, the temperature of the soldering furnace 118 is maintained below a reflow temperature of the solder preform 100. For example, a temperature in the soldering furnace 118 may not exceed 200° C. during the one or more pre-soldering steps. The pre-soldering steps may be performed to decontaminate the soldering furnace 118 and/or to prepare the arrangement 116 of the solder preform 100 in between the substrate 102 and the semiconductor die 104 for enhanced wettability of the solder material.

According to an embodiment, the pre-soldering steps comprise a conditioning step. The conditioning step conditions the chamber of the soldering furnace 118 by removing contaminants. Additionally, the conditioning step evaporates the tacking agent 108 that was used to maintain the position of the semiconductor die 104 relative and the solder preform 100 during the previous assembly steps. The conditioning step may include gradually ramping up the temperature in the soldering furnace 118 from room temperature to an ending temperature of 100° C. to 150° C. The conditioning step may include cycling the pressure in the chamber between high pressure conditions and vacuum conditions. A duration of the conditioning step may be between 300 and 500 seconds.

According to an embodiment, the pre-soldering steps comprise an activation step. The activation step removes oxide from the solder preform 100 and the first and second metal joining surfaces 106, 114 so as to activate these surfaces for enhanced wettability. The activation step may comprise introducing a deoxidizing agent, such as formic acid ($H_2CO_2$), into the soldering furnace 118, such that the ambient atmosphere 122 of the soldering furnace 118 comprises gaseous form of the deoxidizing agent. The activation step may be performed immediately after the conditioning step. During the activation step, the temperature of the soldering furnace 118 may be gradually increased from the temperature of the conditioning step while still being below the reflow temperature of the solder preform 100. For example, the activation step may begin at a temperature of about 100° C. to 150° C. and end at a temperature of no greater than 180° C. to 190° C. A duration of the activation step may be between 420 and 540 seconds.

After performing the pre-soldering steps, the temperature of the soldering furnace 118 is increased to create a reaction in the solder preform 100 and create a soldered joint. During an initial melting phase, the temperature of the soldering furnace 118 is increased to reach a melting temperature of the solder preform 100. This initial melting phase may begin at a temperature of about 180° C. to 190° C. and end at a temperature of about 220° C. to 230° C. A duration of the initial melting phase may be between about 240 and 360 seconds. Subsequently, the temperature of the soldering furnace 118 may be increased such that the solder preform 100 reacts with the first and second metal joining surfaces 106, 114 to form intermetallic phases. During this intermetallic phase formation step, the temperature of the soldering furnace 118 may be increased. For example, the intermetallic phase formation step begin at a temperature of between 220° C. to 230° C. and end at a temperature of between 310° C. to 330° C. A duration of the intermetallic phase formation step may be between 120 and 240 seconds. Finally, the temperature of the soldering furnace 118 may be gradually reduced during a cooling phase such that the soldered joint between the semiconductor die 104 and the substrate 102 cools and hardens.

Figure 3:
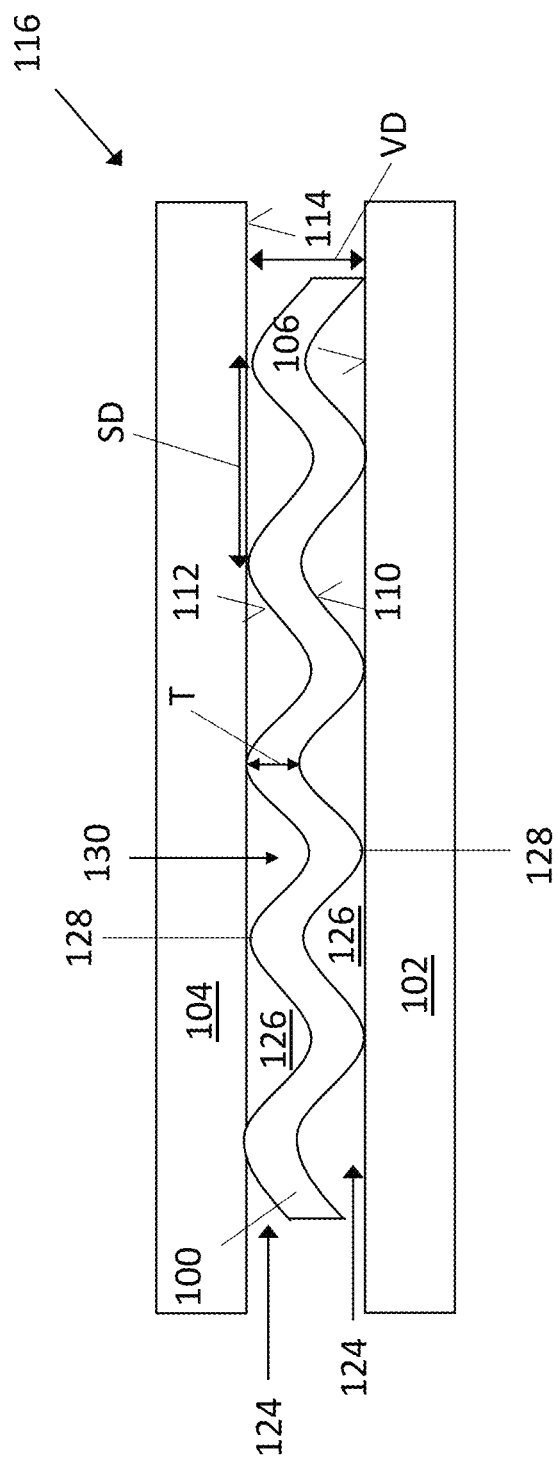
FIG. 3 illustrates a side-view of an arrangement of a solder preform between a substrate and a semiconductor die wherein the solder preform has a varying surface profile, according to an embodiment.

Referring to FIG. 3, a close-up side view of the arrangement 116 of the solder preform 100 in between the substrate 102 and the semiconductor die 104 before melting of the solder preform 100 is depicted, according to an embodiment. In this embodiment, the solder preform 100 is configured such that the first interface surface 110 and the second interface surface 112 each have a varying surface profile 124. A varying surface profile 124 refers to a surface that is non-planar. This non-planarity of the interfacing surfaces of the solder preform 100 creates voids 126 between the solder preform 100 and the substrate 102 and creates voids 126 between the solder preform 100 and the semiconductor die 104. As a result, the ambient atmosphere 122 (or vacuum) contained within the chamber of the soldering furnace 118 can extend into the arrangement 116 directly underneath the semiconductor die 104 and the substrate 102.

The solder preform 100 with the varying surface profile 124 enhances the mechanical pressure-free diffusion soldering process in the following way. The voids 126 between the solder preform 100 and the substrate 102 and/or between the solder preform 100 and the semiconductor die 104 can be configured as channels 130 that permit ingress and egress of the ambient atmosphere 122 within the soldering furnace 118. This improves the efficacy of the pre-soldering steps by facilitating the outgassing of the arrangement 116. In particular, during the conditioning step, vapours of the tacking agent 108 are outgassed through these channels 130. Additionally or alternatively, during the activation step, the formic acid can flow into the arrangement 116 via the channels 130 and the consequent reacted oxide can exit the arrangement 116 via the channels 130.

By way of comparison, a solder preform 100 which has planar surfaces that interface with the semiconductor die 104 and/or substrate 102 is much more prohibitive of the pre-soldering steps. This is especially true at low thickness values for the solder preform 100, e.g., less than 30 μm, less than 15 μm, etc. These low thickness values, while preferable for forming a soldered joint with advantageous intermetallic phase characteristics, tend to cause the solder preform 100 to conform to the surface profile of the semiconductor die 104 and/or substrate 102. This creates a sealing effect that prohibits removal of the tacking agent 108 and/or introduction of the deoxidizing agent. By contrast, the varying surface profile 124 of the solder preform 100 described herein is intentionally formed to have sufficiently course texture to prevent the solder preform 100 from settling into the metal surfaces to which it interfaces with.

The varying surface profile 124 results from a textured profile that includes a plurality of ridges 128 and corresponding channels 130 disposed between immediately adjacent ones of the ridges 128. The ridges 128 refer to the highest point (i.e., the apex of the surface) and the channels 130 refer to the surface between two immediately adjacent ridges 128.

According to an embodiment, the solder preform 100 having the varying surface profile 124 has a thickness (T) of between 5 μm and 15 μm. The thickness (T) of the solder preform 100 refers to a maximum separation distance between the first interface surface 110 and the second interface surface 112 in a direction that is orthogonal to these surfaces. This thickness (T) value produces a soldered joint by a mechanical pressure-free diffusion soldering with advantageous intermetallic phase characteristics. In the depicted embodiment, both of the first interface surface 110 and the second interface surface 112 have the same undulating profile such that the solder preform 100 has a substantially uniform thickness (T) along a cross-section of the solder preform 100 that is orthogonal to the ridges 128 and the channels 130. This thickness (T) may be a single thickness (T) in the range between 5 μm and 15 μm. This is not necessary, however. More generally, the profile of the first interface surface 110 and the second interface surface 112 may deviate from one another, and specific examples of such structures will be described in further detail below. In that case, the thickness (T) of the solder preform 100 may vary across a particular cross-section in the range between 5 μm and 15 μm.

According to an embodiment, the solder preform 100 having the varying surface profile 124 is configured such that a separation distance (SD) between two immediately adjacent ones of the ridges 128 is between two and fifty times the thickness (T) of the solder preform 100. Stated in numerical terms, the separation distance (SD) between two immediately adjacent ones of the ridges 128 may be between 10 μm and 750 μm, for example. This separation distance (SD) may be sufficient to produce voids 126 that are effective and/or to prevent the solder preform 100 from settling in the manner described above.

In the depicted embodiment, the varying surface profile 124 is such that a plurality of the ridges 128 are regularly spaced apart from one another by a fixed separation distance (SD). That is, along a cross-section of the solder preform 100 that is orthogonal to the ridges 128, the apex points occur at a constant wavelength. In that case, the fixed separation distance (SD) can be any value that is between two and fifty times the thickness (T) of the solder preform 100. This arrangement 116 is not necessary, however. In other embodiments, the separation distance (SD) between any two immediately adjacent ones of the ridges 128 may deviate from one another by any value that falls within the range of between two and fifty times the thickness (T) of the solder preform 100.

According to an embodiment, a maximum vertical displacement (VD) of the solder preform 100 between the first interface surface 110 and the second interface surface 112 is between four times the thickness (T) of the solder preform 100 and ten times the thickness (T) of the solder preform 100. The maximum vertical displacement (VD) refers to the largest distance between contact surfaces on opposite sides of the solder preform 100 that are not necessarily laterally aligned with one another. In the depicted embodiment, the maximum vertical displacement (VD) is distance between an apex point on the first interface surface 110 and an apex point on the second interface surface 112. Stated in numerical terms, the maximum vertical displacement (VD) may be between 20 μm and 150 μm, for example. This maximum vertical displacement (VD) may be sufficient to produce voids 126 that are effective and/or to prevent the solder preform 100 from settling in the manner described above.

Figure 4:
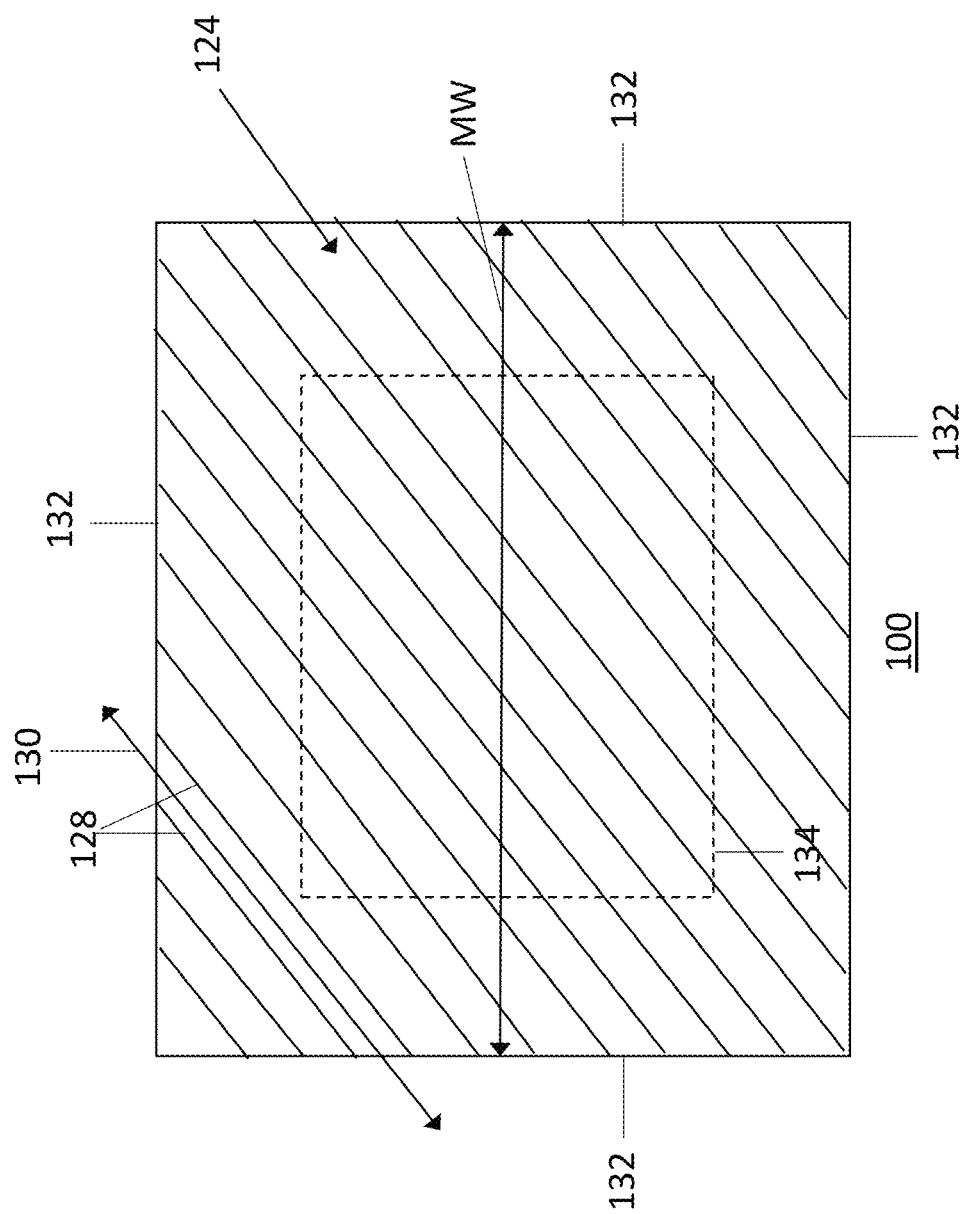
FIG. 4 illustrates a plan-view of a solder preform with a varying surface profile, according to an embodiment.

Referring to FIG. 4, a planar view of the solder preform 100 is shown, according to an embodiment. The planar view may be above either one of the first interface surface 110 or the second interface surface 112. As can be seen, the solder preform 100 is patterned such that the ridges 128 run substantially parallel to one another in a lateral direction across the first interface surface 110 or the second interface surface 112. Correspondingly, the channels 130 in between the ridges 128 run substantially parallel to one another in a lateral direction across the first interface surface 110 or the second interface surface 112. While the ridges 128 and corresponding channels 130 in the depicted embodiment run along a single plane, this is not necessary. For example, the ridges 128 and corresponding channels 130 may have a wavy pattern.

According to an embodiment, at least one of the channels 130 laterally extends completely between two edge sides 132 of the solder preform 100. With this configuration, at least one of the channels 130 provides a complete passage for the ambient atmosphere 122 in the soldering furnace 118 to flow between two edge sides 132 of the solder preform 100. As a result, there can be an unimpeded flow of gas through the arrangement 116, which enhances the efficacy of the pre-soldering steps described above. As shown, the varying surface profile 124 has a diagonal pattern such that the channels 130 extend between two orthogonal edge sides 132. More generally, the pattern of the ridges 128 can be in any orientation.

According to an embodiment, at least one of the channels 130 laterally extends from one edge side of the solder preform 100 to a central region 134 of the solder preform 100. The central region 134 is spaced apart from every edge side 132 of the solder preform 100. According to an embodiment, a distance between the central region 134 and the every edge side 132 is between about 1-3 mm (millimetres). In one particular embodiment, the central region 134 is spaced apart from every edge side 132 of the solder preform 100 by 2 mm at every edge side. In general percentage terms, the distance between the central region 134 and the every edge side 132 can be in the range of 10% to 50% of an overall width of the solder preform. The central region 134 is a region is ordinarily sealed off from the ambient atmosphere 122 in the case of a solder preform 100 that does not comprise the varying surface profile 124 as described herein. Thus, by configuring the solder preform 100 such that the channels 130 extend into this central region 134, the efficacy of the pre-soldering steps described above is enhanced because the tacking agent 108 can be more effectively removed from the central region 134 and because portions of the first and second metal joining surfaces 106, 114 directly overlapping with the central region 134 can be more effectively deoxidized.

Referring to FIG. 5, various embodiments of a solder preform 100 with a varying surface profile 124 are shown.

FIG. 5A illustrates an example of a solder preform 100 wherein only one of the two interface surfaces has the varying surface profile 124. Hence, this type of solder preform 100 creates the voids 126 between the solder preform 100 and only one of the substrate 102 and the semiconductor die 104 before the melting of the solder preform 100. For example, the solder preform 100 of FIG. 5A may be arranged on the substrate 102 such that the rear planar surface corresponds to the first interface surface 110 and such that the varying surface profile 124 surface corresponds to the second interface surface 112. In that case, the voids 126 form between the semiconductor die 104 and the solder preform 100. Alternatively, the solder preform 100 may be flipped upside down such that the varying surface profile 124 surface corresponds to the first interface surface 110 and the rear planar surface corresponds to the second interface surface 112. In that case, the voids 126 form between the substrate 102 and the solder preform 100. This solder preform 100 geometry may be preferable or acceptable if a particular metal surface is especially susceptible to oxidation with the other one being less-so. FIG. 5B illustrates an example of a solder preform 100 wherein the varying surface profile 124 has abrupt angled transitions instead of a gradually undulating, i.e., curved profile. FIG. 5C illustrates another example of a solder preform 100 with abrupt angled transitions, wherein the bottoms of the channels 130 are widened to create a large volume. These two profiles may be preferred and/or acceptable alternatives, depending on the material and processes used to form the patterns.

More generally, the varying surface profile 124 can have a wide variety of geometries different from the specific embodiments described herein while providing the advantageous ingress and egress of the ambient atmosphere 122 during the pre-soldering steps as described above. For example, different radii, widths, angles, etc., may be provided in the varying surface profile 124 from what is shown. Additionally or alternatively, the first and second interfacing surfaces may differ from one another, and may have any of the varying surface profile 124 characteristics described herein.

A solder preform 100 having the varying surface profile 124 may be formed according to the following technique. Initially, a preformed planar sheet of solder material having a thickness of, e.g., between 5 μm and 30 μm, may be provided. Subsequently, the preformed planar sheet of solder material is arranged between two pick and place tools and pressed together to obtain the desired surface profile. At least one of the two pick and place tools has a varying surface and imprints this into the solder to form the varying surface profile 124. In the case that the varying surface profile 124 is to be provided on both sides of the solder preform 100, e.g., as shown in FIG. 3, two pick and place tools are pressed against opposite sides of the solder material, with the lower tool being the negative imprint of the upper tool. If the varying surface profile 124 is to be provided on only one side, e.g., as shown in FIG. 5A, the upper one of the pick and place tools may have the desired imprint profile with the lower tool having a planar surface. The upper pick and place tool can be formed from a porous hard material, e.g., metal, and may include vacuum holes. The lower pick and place tool may be formed from a hard bulk material, e.g., metal, or a soft elastic material, e.g., rubber or plastic.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of soldering a semiconductor device, the method comprising:
   providing a substrate comprising a first metal joining surface;
   providing a semiconductor die comprising a second metal joining surface;
   providing a solder preform that comprises a first interface surface and a second interface surface opposite the first interface surface;
   arranging the solder preform in between the substrate and the semiconductor die such that the first interface surface faces the first metal joining surface and such that the second interface surface faces the second metal joining surface; and
   performing a mechanical pressure-free diffusion soldering process that forms a soldered joint between the substrate and the semiconductor die by melting the solder preform and forming intermetallic phases in the soldered joint;
   wherein one or both of the first interface surface and the second interface surface has a varying surface profile that creates voids between the solder preform and one or both of the substrate and the semiconductor die before the melting of the solder preform.

2. The method of claim 1, wherein the varying surface profile comprises a plurality of ridges and channels that are disposed between immediately adjacent ones of the ridges, and wherein the channels create the voids in the arrangement of the solder preform in between the substrate and the semiconductor die.

3. The method of claim 2, wherein at least one of the channels laterally extends completely between two edge sides of the solder preform.

4. The method of claim 2, wherein at least one of the channels laterally extends from one edge side of the solder preform to a central region of the solder preform, wherein the central region is spaced apart from every edge side of the solder preform by at least 1 mm.

5. The method of claim 2, wherein the ridges and channels have an undulating profile along a cross-section of the solder preform that is orthogonal to the ridges.

6. The method of claim 5, wherein both of the first interface surface and the second interface surface have the same undulating profile, and wherein the solder preform has a substantially uniform thickness along the cross-section of the solder preform that is orthogonal to the ridges.

7. The method of claim 2, wherein a thickness of the solder perform is between 5 μm and 15 μm.

8. The method of claim 7, wherein a separation distance between two immediately adjacent ones of the ridges is between two and fifty times the thickness of the solder preform.

9. The method of claim 8, wherein the varying surface profile is such that a plurality of the ridges are regularly spaced apart from one another by a fixed separation distance that is between two and fifty times the thickness of the solder preform.

10. The method of claim 7, wherein a maximum vertical displacement of the solder preform between the first interface surface and the second interface surface is between four times the thickness of the solder preform and ten times the thickness of the solder preform.

11. The method of claim 1, wherein the solder preform comprises Sn, Zn, In, Ga, Bi, Cd or any alloy thereof.

12. The method of claim 1, wherein performing the mechanical pressure-free diffusion soldering process comprises a conditioning step that removes a tacking agent from the arrangement of the solder preform in between the substrate and the semiconductor die.

13. The method of claim 1, wherein performing the mechanical pressure-free diffusion soldering process comprises an activation step that introduces formic acid into a soldering furnace that contains the arrangement of the solder preform in between the substrate and the semiconductor die.

14. A method of soldering a semiconductor device, the method comprising:
   providing a substrate comprising a first metal joining surface;
   providing a semiconductor die comprising a second metal joining surface;
   providing a solder preform that comprises a first interface surface and a second interface surface opposite the first interface surface;
   arranging the solder preform in between the substrate and the semiconductor die such that the first interface surface faces the first metal joining surface and such that the second interface surface faces the second metal joining surface;
   placing the arrangement of the solder preform in between the substrate and the semiconductor die in a soldering furnace;
   performing one or more pre-soldering steps in the soldering furnace below a reflow temperature of the solder preform with the arrangement of the solder preform contained in the soldering furnace;
   increasing the temperature of the soldering furnace to reach a melting temperature of the solder preform such that the solder preform melts and reacts with the first and second metal joining surfaces to form intermetallic phases in a soldered joint without applying mechanical pressure to the arrangement,
   wherein during the pre-soldering steps the arrangement of the solder preform in between the substrate and the semiconductor die comprises channels between the solder preform and one or both of the substrate and the semiconductor die, and
   wherein the channels permit ingress and egress of ambient atmosphere within the soldering furnace.

* * * * *